United States Patent
Lee et al.

(10) Patent No.: US 9,840,059 B2
(45) Date of Patent: Dec. 12, 2017

(54) FINE PATTERN STRUCTURES HAVING BLOCK CO-POLYMER MATERIALS

(71) Applicant: SK hynix Inc., Icheon (KR)

(72) Inventors: Jung Hyung Lee, Seoul (KR); Cheol Kyu Bok, Pohang (KR); Keun Do Ban, Yongin (KR); Myoung Soo Kim, Seongnam (KR); Ki Lyoung Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 419 days.

(21) Appl. No.: 14/738,756

(22) Filed: Jun. 12, 2015

(65) Prior Publication Data

US 2015/0273790 A1    Oct. 1, 2015

Related U.S. Application Data

(63) Continuation of application No. 14/229,698, filed on Mar. 28, 2014, now Pat. No. 9,086,632.

(30) Foreign Application Priority Data

Dec. 2, 2013  (KR) .................. 10-2013-0148248

(51) Int. Cl.
*B32B 3/26* (2006.01)
*B32B 27/08* (2006.01)
*G03F 7/40* (2006.01)
*G03F 7/00* (2006.01)

(52) U.S. Cl.
CPC .............. *B32B 3/263* (2013.01); *B32B 27/08* (2013.01); *G03F 7/0002* (2013.01); *G03F 7/40* (2013.01); *B32B 2457/00* (2013.01); *B32B 2457/20* (2013.01); *B32B 2457/206* (2013.01); *B32B 2551/00* (2013.01); *Y10T 428/24612* (2015.01)

(58) Field of Classification Search
CPC ..................................................... G03F 7/0002
See application file for complete search history.

(56) References Cited

FOREIGN PATENT DOCUMENTS

KR    10-2011-0135294 A    12/2011

*Primary Examiner* — Ian Rummel

(57) ABSTRACT

A fine pattern structure includes a lower hard mask layer on a pattern formation layer having a first region and a second region, first upper hard mask patterns disposed on the lower hard mask layer in the first region to expose portions of the lower hard mask layer, a second upper hard mask pattern covering the lower hard mask layer in the second region, guide patterns on the first and second upper hard mask patterns, neutralization patterns on the exposed portions of the lower hard mask layer in the first region, a first block co-polymer layer covering the guide patterns in the first region and the neutralization patterns, and a second block co-polymer layer covering the guide pattern in the second region.

12 Claims, 12 Drawing Sheets

FINE PATTERN STRUCTURES HAVING BLOCK CO-POLYMER MATERIALS

CROSS-REFERENCE TO RELATED APPLICATION

This application is a continuation of U.S. patent application Ser. No. 14/229,698 filed on Mar. 28, 2014, entitled FINE PATTERN STRUCTURES HAVING BLOCK CO-POLYMER MATERIALS AND METHOD OF FABRICATING THE SAME, which claims priority under 35 U.S.C 119(a) to Korean Application No. 10-2013-0148248, filed on Dec. 2, 2013, in the Korean Intellectual Property Office, the disclosures of which are incorporated herein by reference in their entireties.

BACKGROUND

Processes and materials for fabricating nano-sized structures are increasingly in demand with the development of mechanical, electrical, chemical and biological devices (or systems) having nano-scale components. Particularly, as the nano-scale components are scaled down to have a size of several tens of nanometers, need of the processes and materials for fabricating the nano-sized structures is rapidly increasing.

SUMMARY

Embodiments of the present disclosure relate to semiconductor devices, and more particularly, to fine pattern structures having block co-polymer materials.

Various embodiments are directed to fine pattern structures having block co-polymer materials and methods of fabricating the same.

According to some embodiments, a fine pattern structure includes a lower hard mask layer disposed on a pattern formation layer having a first region and a second region, a plurality of first upper hard mask patterns disposed on the lower hard mask layer in the first region to expose portions of the lower hard mask layer, a second upper hard mask pattern covering an entire surface of the lower hard mask layer in the second region, guide patterns on respective ones of the first and second upper hard mask patterns, a plurality of neutralization patterns on respective ones of the exposed portions of the lower hard mask layer in the first region, a first block co-polymer layer covering the guide patterns in the first region and the plurality of neutralization patterns, and a second block co-polymer layer covering the guide pattern in the second region.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

A plurality of patterns may be uniformly formed in a predetermined portion of the given region using a block co-polymer (BCP) material. However, undesired random patterns may be non-uniformly formed in a remaining portion of the given region. Thus, additional processes may be performed to prevent the undesired patterns from being formed in the remaining portion of the given region. For example, an additional photo mask may be used to prevent the undesired patterns from being formed in the remaining portion of the given region.

Embodiments of the present disclosure relate to structures which prevent non-ordered BCP structures from being transferred into an underlying pattern layer. The fine pattern structures may be applied to memory devices such as dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices and ferroelectric random access memory (FeRAM) devices, and logic devices such as controllers and microprocessors. In the following embodiments, it will be understood that when an element is referred to as being located "on", "over", "above", "under", "beneath" or "below" another element, it can be directly contact the other element, or at least one intervening element may also be present therebetween. Accordingly, the terms such as "on", "over", "above", "under", "beneath", "below" and the like which are used herein are for the purpose of describing particular embodiments only and are not intended to limit the scope of the present disclosure.

Figure 1:
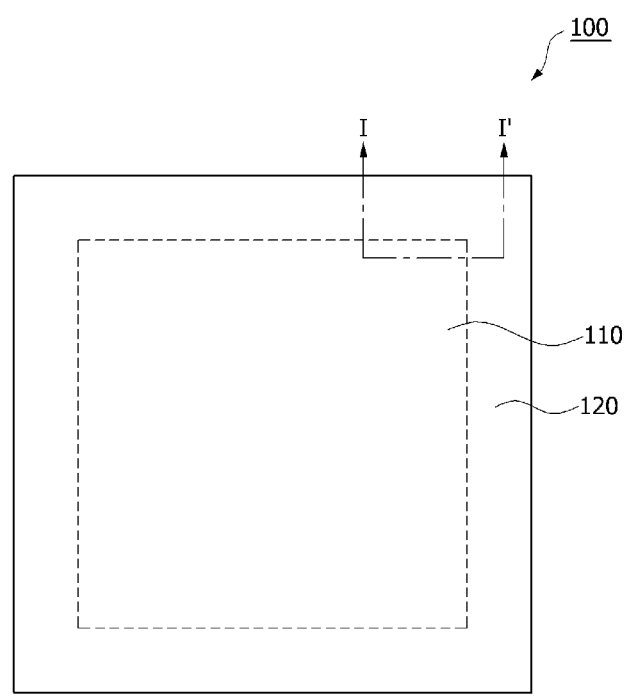
FIG. 1 is a plan view illustrating a structure according to an embodiment of the present disclosure.

Referring to FIG. 1, a fine pattern structure 100 may include a first region 110 and a second region 120 which are distinct from each other. Although FIG. 1 illustrates a configuration in which the first region 110 is surrounded by the second region 120, this configuration is merely one example. In other embodiments, the first and second regions 110 and 120 may be arranged differently from the configuration shown in FIG. 1.

In some embodiments, the fine pattern structure 100 may include a semiconductor substrate such as a silicon substrate and an insulation layer or a conductive layer disposed on the semiconductor substrate. The first region 110 may correspond to a region in which BCP layer patterns are transferred to a pattern formation layer, and the second region 120 may correspond to a non-pattern region in which BCP patterns are not transferred to a pattern formation layer. In some embodiments, the first region 110 may correspond to a cell region of a semiconductor device, and the second region 120 may correspond to a peripheral circuit region of the semiconductor device.

Figure 2:
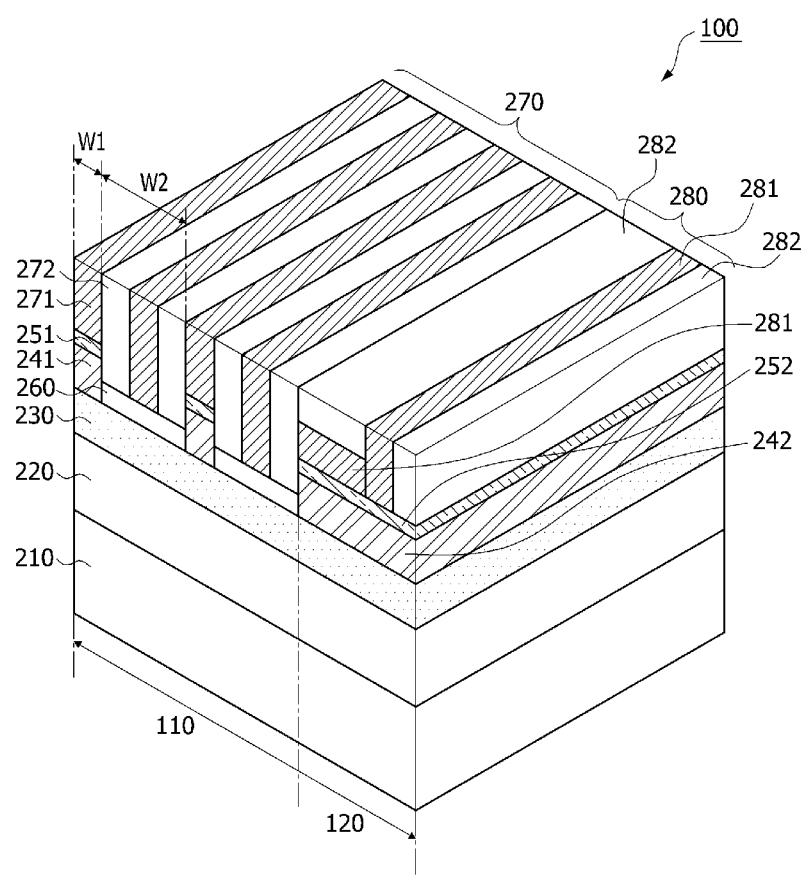
FIG. 2 is a perspective view including a cross-section taken along line I-I' of FIG. 1.

Referring to FIG. 2, a pattern formation layer 220 is disposed on a substrate 210. Although not shown in the drawings, another layer may be disposed between the substrate 210 and the pattern formation layer 220. In some embodiments, the substrate 210 may be a semiconductor substrate such as a silicon substrate. Alternatively, the substrate 210 may be an insulation substrate or a glass substrate. In some embodiments, the pattern formation layer 220 may be a conductive layer or an insulation layer in which final patterns are formed. Alternatively, the pattern formation layer 220 may be a hard mask layer that is used as an etch mask layer when an underlying layer is patterned.

In an embodiment, the pattern formation layer 220 may include a carbon layer. A lower hard mask layer 230 may be disposed on the pattern formation layer 220. The lower hard mask layer 230 may be used as an etch mask layer while portions of the pattern formation layer 220 are selectively etched. Thus, the lower hard mask layer 230 may include a material having an etch selectivity with respect to the pattern formation layer 220. When the pattern formation layer 220 is a carbon layer, the lower hard mask layer 230 may include a silicon oxynitride (SiON) layer.

Upper hard mask layers 241 and 242 may be disposed on the lower hard mask layer 230. While the upper hard mask layer 241 in the first region 110 has a patterned shape, the upper hard mask layer 242 in the second region 120 may have a plate shape to cover an entire surface of the lower hard mask layer 230 in the second region 120. Hereinafter, the upper hard mask layers 241 in the first region 110 and the upper hard mask layer 242 in the second region 120 will be referred to as first upper hard mask patterns 241 and a second upper hard mask pattern 242, respectively. As described with reference to FIG. 1, the first region 110 may be a pattern region in which patterns are formed in pattern formation layer 220 using a BCP layer, and the second region 120 may be a non-pattern region in which no patterns are formed in pattern formation layer 220 regardless of presence of the BCP layer.

The upper hard mask patterns 241 and 242 may be used as an etch mask layer while portions of the lower hard mask layer 230 are selectively etched. Thus, the upper hard mask patterns 241 and 242 may include a material having an etch selectivity with respect to the lower hard mask layer 230. In an embodiment in which the lower hard mask layer 230 is a silicon oxynitride (SiON) layer, the upper hard mask patterns 241 and 242 may include an oxide layer such as an undoped silicate glass (USG) layer.

In the first region 110, the first upper hard mask patterns 241 may be regularly arrayed to have a predetermined pitch. Thus, portions of the lower hard mask layer 230 in the first region 110 may be exposed between portions of the first upper hard mask patterns 241. Neutralization patterns 260 may be disposed on the exposed portions of the lower hard mask layer 230 in the first region 110. That is, the first upper hard mask patterns 241 and the neutralization patterns 260 may be alternately arrayed on the lower hard mask layer 230 in the first region 110.

In an embodiment, a width W2 of each of the neutralization patterns 260 may be three times or greater than three times a width W1 of each of the first upper hard mask patterns 241. A thickness of the neutralization patterns 260 may be less than a thickness of the first upper hard mask patterns 241. In some embodiments, each of the neutralization patterns 260 may include a neutral surface having a surface energy of about 38 dyne/cm to about 45 dyne/cm. The neutralization patterns 260 may include an organic material.

The second upper hard mask pattern 242 may cover an entire surface of the lower hard mask layer 230 in the second region 120. Since the second region 120 is a non-pattern region, no pattern images are transferred into the second upper hard mask pattern 242 in the second region 120 while the first upper hard mask patterns 241 in the first region 110 are formed. Thus, in an embodiment, the second upper hard mask pattern 242 in the second region 120 have a thickness sufficient to prevent pattern images from being transferred into the lower hard mask layer 230 in the second region 120 when first polymer blocks constituting a BCP layer in the first region 110, exposed portions of the neutralization patterns 260, and exposed portions of the lower hard mask layer 230 are removed.

Guide layers 251 may be disposed on the first upper hard mask patterns 241 in the first region 110, and a guide layer 252 may be disposed on the second upper hard mask pattern 242 in the second region 120. While the guide layers 251 in the first region 110 has a patterned shape, the guide layer 252 in the second region 120 may have a plate shape covering an entire surface of the second upper hard mask pattern 242 in the second region 120. Hereinafter, the guide layers 251 in the first region 110 and the guide layer 252 in the second region 120 will be referred to as guide patterns 251 and a guide pattern 252, respectively. The first region 110 may include a plurality of guide patterns 251 and the second region 120 may include a single guide pattern 252.

In an embodiment, the guide patterns 251 in the first region 110 may be vertically aligned with the first upper hard mask patterns 241. That is, sidewalls of the guide patterns 251 may be vertically aligned, or contiguous, with sidewalls of the first upper hard mask patterns 241. Each of the guide patterns 251 and the guide pattern 252 may include the same material as one of the polymer blocks of the block copolymer in a BCP layer 270.

A BCP layer 270 may be disposed on the guide patterns 251 and the neutralization patterns 260 in the first region 110, and a BCP layer 280 may be disposed on the guide pattern 252 in the second region 120. Herein, the BCP layer 270 disposed in the first region 110 may be referred to as a first BCP layer 270 and the BCP layer 280 disposed in the second region 120 may be referred to as a second BCP layer 280. The first and second BCP layers 270 and 280 may be formed in a single process step.

The first BCP layer 270 in the first region 110 may include first polymer blocks 271 and second polymer blocks 272. The first polymer blocks 271 and the second polymer blocks 272 may be alternately arrayed. For example, some of the first polymer blocks 271 may be disposed on the guide patterns 251, and the remaining first polymer blocks 271 and the second polymer blocks 272 may be alternately arrayed on the neutralization patterns 260 in a horizontal direction as seen in FIG. 2.

In such an embodiment, each of the second polymer blocks 272 may be disposed adjacent to one of the first polymer blocks 271 disposed on the guide patterns 251. In an embodiment in which the width W2 of each neutralization pattern 260 is about three times the width W1 of each of the first upper hard mask patterns 241, three polymer blocks (e.g., one of the first polymer blocks 271 and two of the second polymer blocks 272) may be laterally arrayed on each neutralization pattern 260. Alternatively, in an embodiment in which the width W2 of each neutralization pattern 260 is over three times the width W1 of each of the first upper hard mask patterns 241, four or more polymer blocks may be laterally arrayed on each neutralization pattern 260.

The second BCP layer 280 in the second region 120 may include at least one first polymer block 281 and at least one second polymer block 282. Since the second region 120 includes the single guide pattern 252, the at least one first polymer block 281 and the at least one second polymer block 282 may be randomly arrayed on the single guide pattern 252. That is, the at least one first polymer block 281 and the at least one second polymer blocks 282 may be alternately arrayed in a horizontal direction in a portion of the second region 120, and the at least one first polymer block 281 and the at least one second polymer blocks 282 may be sequentially stacked in a vertical direction in another portion of the second region 120.

In some embodiments, the first BCP layer 270 and the second BCP layer 280 may be the same BCP material which is formed in the same process step. In such an embodiment, the first polymer blocks 271 of the first BCP layer 270 may be the same material as the first polymer blocks 281 of the second BCP layer 280, and the second polymer blocks 272 of the first BCP layer 270 may be the same material as the second polymer blocks 282 of the second BCP layer 280. In an embodiment, the first and second BCP layers 270 and 280 may be formed of a polystyrene-polymethylmethacrylate (PS-PMMA) co-polymer material. Thus, if the guide patterns 251 and the guide pattern 252 are polystyrene (PS) blocks, the first polymer blocks 271 and 281 may be PS blocks and the second polymer blocks 272 and 282 may be PMMA blocks.

In some embodiments, the first and second BCP layers 270 and 280 may be formed of polybutadiene-polybutylmethacrylate co-polymer, polybutadiene-polydimethylsiloxane co-polymer, polybutadiene-polymethylmethacrylate co-polymer, polybutadienepolyvinylpyridine co-polymer, polybutylacrylate-polymethylmethacrylate co-polymer, polybutylacrylate-polyvinylpyridine co-polymer, polyisoprene-polyvinylpyridine co-polymer, polyisoprene-polymethylmethacrylate co-polymer, polyhexylacrylatepolyvinylpyridine co-polymer, polyisobutylene-polybutylmethacrylate co-polymer, polyisobutylene-polymethylmethacrylate co-polymer, polyisobutylene-polybutylmethacrylate co-polymer, polyisobutylene-polydimethylsiloxane co-polymer, polybutylmethacrylate-polybutylacrylate co-polymer, polyethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyvinylpyridine co-polymer, polyvinylpyridine-polymethylmethacrylate co-polymer, polyethyleneoxide-polyisoprene co-polymer, polyethyleneoxide-polybutadiene co-polymer, polyethyleneoxide-polystyrene co-polymer, polyethyleneoxide-polymethylmethacrylate co-polymer, polyethyleneoxide-polydimethylsiloxane co-polymer, or polystyrene-polyethyleneoxide co-polymer. In other embodiments, the first and second BCP layers 270 and 280 may be formed of a tri-block co-polymer material having three distinct polymer blocks or a multi-block co-polymer material having four or more distinct polymer blocks.

FIGS. 3 to 22 are schematic views illustrating a method of fabricating a fine pattern structure according to an embodiment of the present disclosure. FIGS. 4, 6, 8, 10, 12, 14, 16, 18, 20 and 22 are cross-sectional views taken along lines II-II' of FIGS. 3, 5, 7, 9, 11, 13, 15, 17, 19 and 21, respectively.

Figure 3:
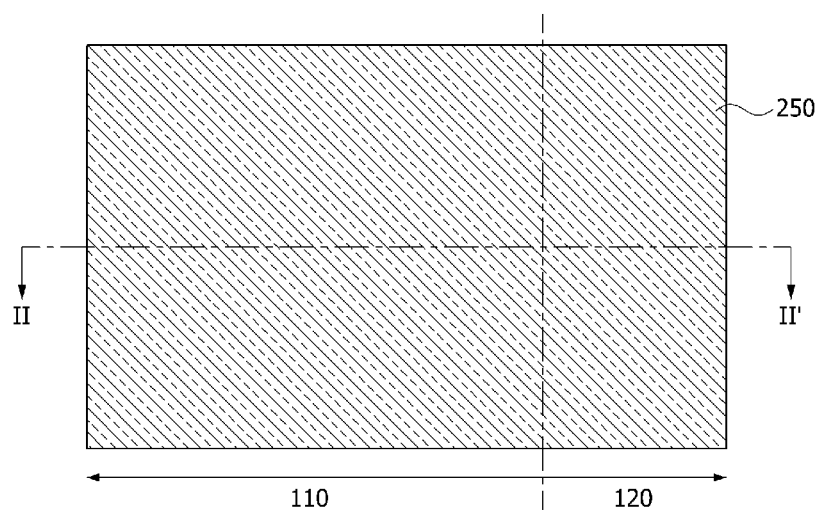
FIGS. 3 to 22 are schematic views illustrating a method of fabricating a fine pattern structure according to an embodiment of the present disclosure.
Figure 4:
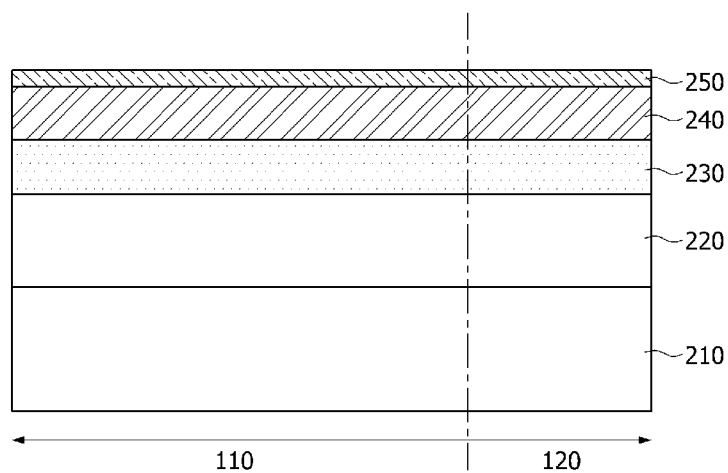

Referring to FIGS. 3 and 4, a lower hard mask layer 230 may be formed on a pattern formation layer 220 disposed on a substrate 210 having a first region 110 and a second region 120. The first region 110 may be a pattern region in which fine patterns are formed, and the second region may be a non-pattern region in which no fine patterns are formed below BCP layers, and in which no patterns are formed in a pattern formation layer. In some embodiments, the substrate 210 may be a semiconductor substrate such as a silicon substrate or an insulation substrate such as a glass substrate.

The pattern formation layer 220 may be a layer in which final patterns are formed. Alternatively, the pattern formation layer 220 may be a hard mask layer that is used as an etch mask when an underlying layer is patterned. In such an embodiment, at least one layer may be additionally formed between the substrate 210 and the pattern formation layer 220.

In some embodiments, the pattern formation layer 220 may include a carbon layer. The lower hard mask layer 230 may be used as an etch mask while portions of the pattern formation layer 220 are selectively etched in a subsequent process. Thus, the lower hard mask layer 230 may be formed of a material having an etch selectivity with respect to the pattern formation layer 220. When the pattern formation layer 220 is formed of a carbon layer, the lower hard mask layer 230 may be formed of a silicon oxynitride (SiON) layer.

An upper hard mask layer 240 may be formed on the lower hard mask layer 230. The upper hard mask layer 240 may be used as an etch mask layer while portions of the lower hard mask layer 230 are selectively etched in a subsequent process. Thus, the upper hard mask layer 240 may be formed to include a material having an etch selectivity with respect to the lower hard mask layer 230. When the lower hard mask layer 230 is formed of a silicon oxynitride (SiON) layer, the upper hard mask layer 240 may be formed to include an oxide layer, for example, an undoped silicate glass (USG) layer. The upper hard mask layer 240 may be formed to have a sufficient thickness to remain over the entire second region 120 while a patterning process is performed in the first region 110.

A guide layer 250 may then be formed on the upper hard mask layer 240. The guide layer 250 may be formed of a material which includes a polymer of a polymer block in a block co-polymer (BCP) layer which is formed in a subsequent process. For example, if the BCP layer is formed of a polystyrene-polymethylmethylacrylate (PS-PMMA) co-polymer material, the guide layer 250 may be formed of polystyrene (PS).

Figure 5:
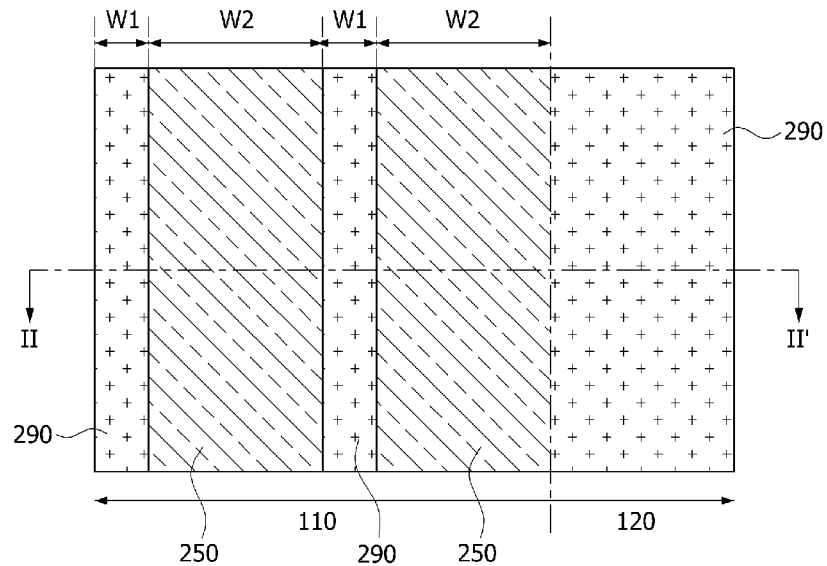
Figure 6:
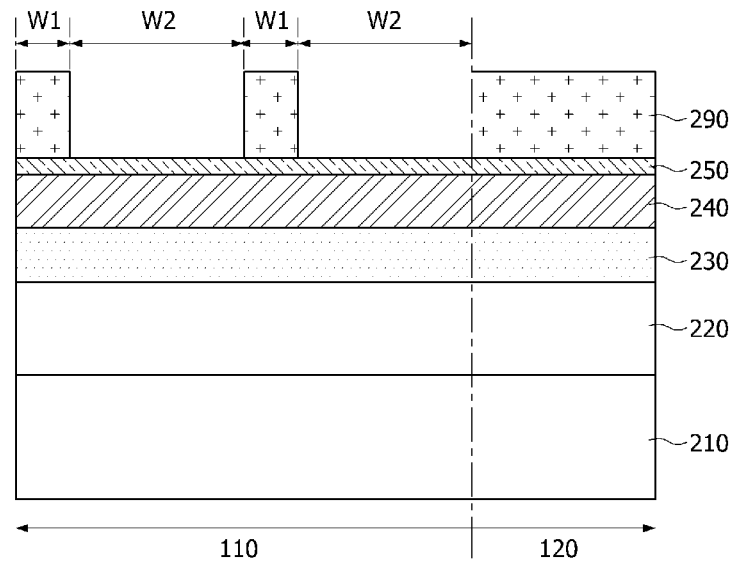

Referring to FIGS. 5 and 6, photoresist patterns 290 may be formed on the guide layer 250. While the photoresist patterns 290 in the first region 110 may expose portions of the guide layer 250, the photoresist pattern 290 in the second region 120 may cover an entire surface of the guide layer 250 located in the second region 120. In some embodiments, the photoresist patterns 290 in the first region 110 may be line patterns which are regularly arrayed to have a predetermined pitch. That is, the photoresist patterns 290 in the first region 110 may be formed to have a line and space form.

A width W2 of spaces between the photoresist patterns 290 in the first region 110 may be at least three times a width W1 of each photoresist pattern 290 in the first region 110. In an embodiment, the width W1 may be controlled to be substantially the same as a width of fine patterns which are formed in or below pattern formation layer 220. Thus, a trimming process may be applied to the photoresist patterns 290 to control the width W1 of the photoresist patterns 290 in the first region 110.

Figure 7:
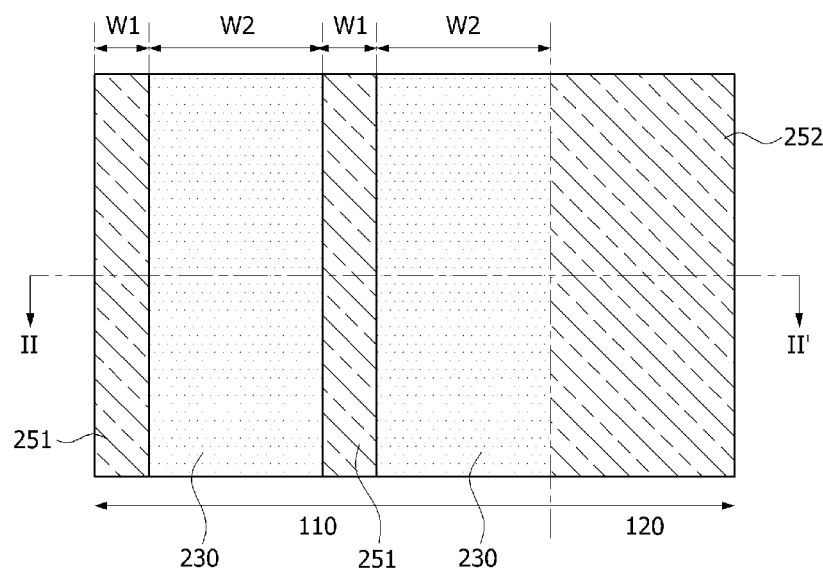
Figure 8:
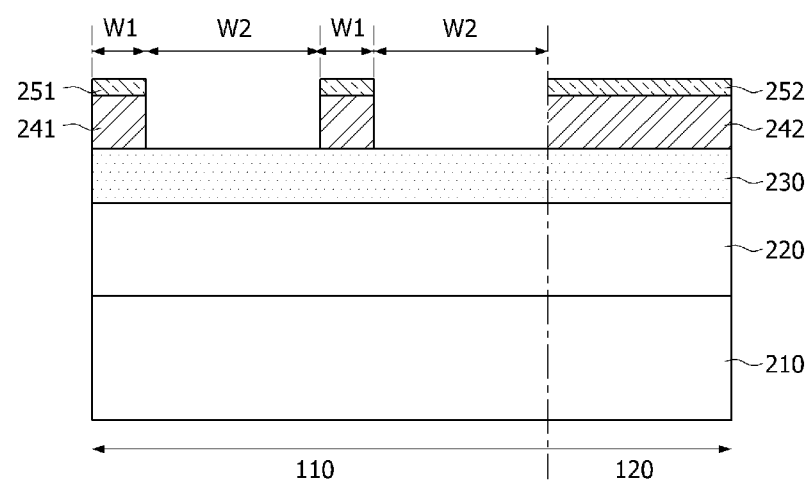

Referring to FIGS. 7 and 8, the guide layer 250 and the upper hard mask layer 240 may be etched using the photoresist patterns 290 as etch masks. After etching the guide layer 250 and the upper hard mask layer 240, all of the photoresist patterns 290 may be removed. As a result, first upper hard mask patterns 241 and guide patterns 251 may be formed in the first region 110 to expose portions of the lower hard mask layer 230, and second upper hard mask pattern 242 and guide pattern 252 may be formed in the second region 120 to cover an entire surface of the lower hard mask layer 230.

Each of the first upper hard mask patterns 241 and the guide patterns 251 in the first region 110 may have a width which is substantially the same as the width W1 of each photoresist pattern 290 formed in the first region 110. In addition, a width of each of the exposed portions of the lower hard mask layer 230 may be substantially the same as the width W2 of each of the spaces between the photoresist patterns 290 in the first region 110. Thus, the width W2 of each of the exposed portions of the lower hard mask layer 230 may also be at least three times the width W1 of each of the first upper hard mask patterns 241 and the guide patterns 251.

Figure 9:
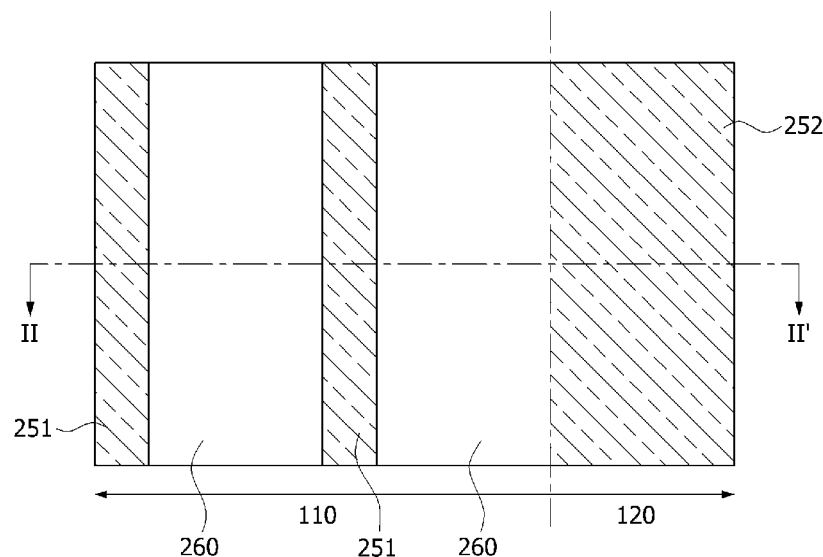
Figure 10:
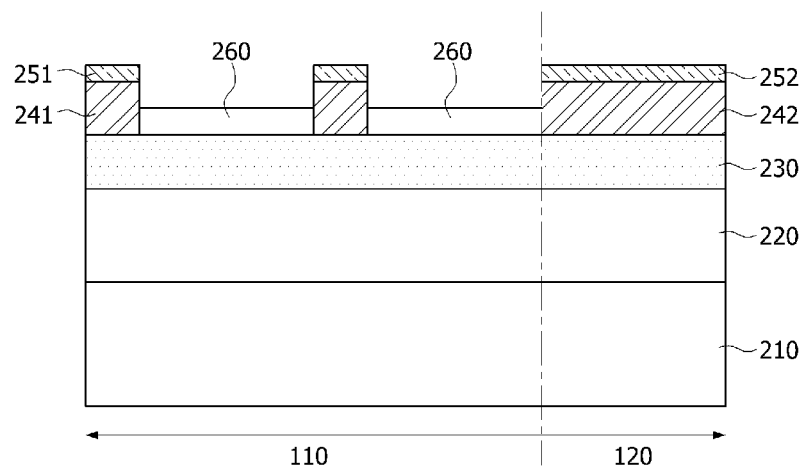

Referring to FIGS. 9 and 10, a neutralization layer may be formed on a top surface of the substrate in at least the first region 110, and the neutralization layer may be recessed to expose the guide patterns 251 and 252 and to form neutralization patterns 260 on the exposed portions of the lower hard mask layer 230. The neutralization layer may be recessed such that a thickness of the neutralization patterns 260 is less than a thickness of the first upper hard mask patterns 241. The neutralization patterns 260 may be formed without removing portions of the guide pattern 252 in the second region 120.

In some embodiments, the neutralization patterns 260 may be formed of an organic material. Each of the neutralization patterns 260 may be formed to include a neutral surface having a surface energy of about 38 dyne/cm to about 45 dyne/cm. Because the neutralization patterns 260 are formed to have neutral surfaces, a plurality of polymer blocks of a BCP layer formed in a subsequent process may be phase-separated and vertically aligned on the neutralization patterns 260.

Figure 11:
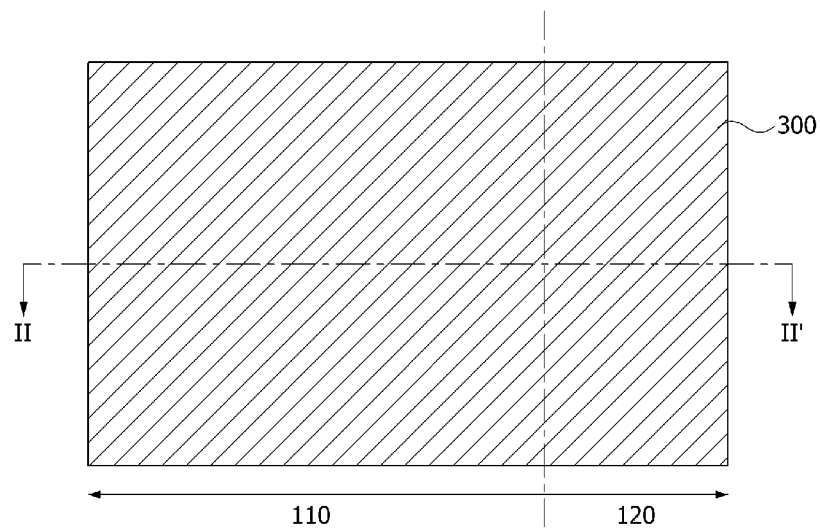
Figure 12:
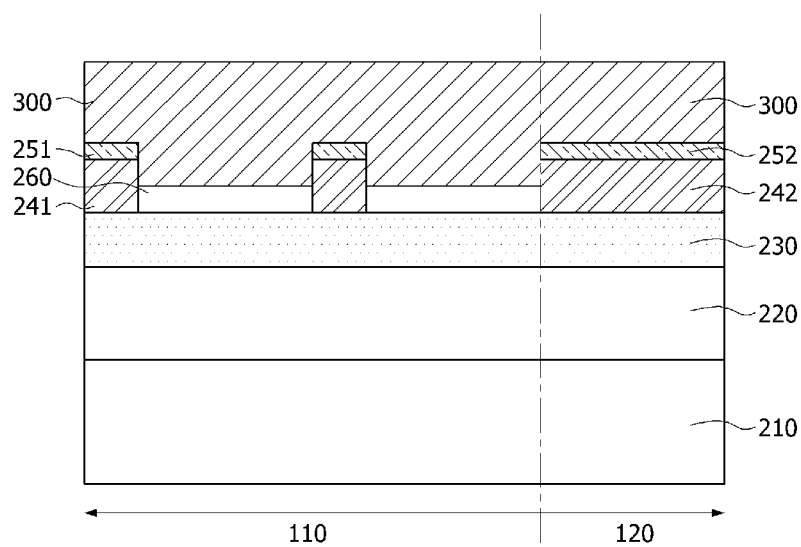

Referring to FIGS. 11 and 12, a BCP layer 300 may be formed on the guide patterns 251, the neutralization patterns 260 and the guide pattern 252. The BCP layer 300 may be formed using a spin coating process. In some embodiments, the BCP layer 300 may include first polymer blocks and second polymer blocks which are combined with each other by covalent bonds. In such an embodiment, a volume ratio of the first polymer blocks and second polymer blocks may be about 1:1. In an embodiment, the BCP layer 300 may be formed of a polystyrene-polymethylmethacrylate (PS-PMMA) co-polymer material including polystyrene (PS) blocks (corresponding to the first polymer blocks) covalently bonded to polymethylmethacrylate (PMMA) blocks (corresponding to the second polymer blocks).

However, the PS-PMMA co-polymer material is merely an example of a suitable material for the BCP layer 300. In some embodiments, the BCP layer 300 may be formed of polybutadiene-polybutylmethacrylate co-polymer, polybutadiene-polydimethylsiloxane co-polymer, polybutadiene-polymethylmethacrylate co-polymer, polybutadiene-polyvinylpyridine co-polymer, polybutylacrylate-polymethylmethacrylate co-polymer, polybutylacrylate-polyvinylpyridine co-polymer, polyisoprene-polyvinylpyridine co-polymer, polyisoprene-polymethylmethacrylate co-polymer, polyhexylacrylate-polyvinylpyridine co-polymer, polyisobutylene-polybutylmethacrylate co-polymer, polyisobutylene-polymethylmethacrylate co-polymer, polyisobutylene-polybutylmethacrylate co-polymer, polyisobutylene-polydimethylsiloxane co-polymer, polybutylmethacrylate-polybutylacrylate co-polymer, polyethylethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyvinylpyridine co-polymer, polyvinylpyridine-polymethylmethacrylate co-polymer, polyethyleneoxide-polyisoprene co-polymer, polyethyleneoxide-polybutadiene co-polymer, polyethyleneoxide-polystyrene co-polymer, polyethyleneoxide-polymethylmethacrylate co-polymer, polyethyleneoxide-polydimethylsiloxane co-polymer, or polystyrene-polyethyleneoxide co-polymer. Alternatively, the BCP layer 300 may be formed of a tri-block co-polymer material having three distinct polymer blocks or a multi-block co-polymer material having four or more distinct polymer blocks.

Figure 13:
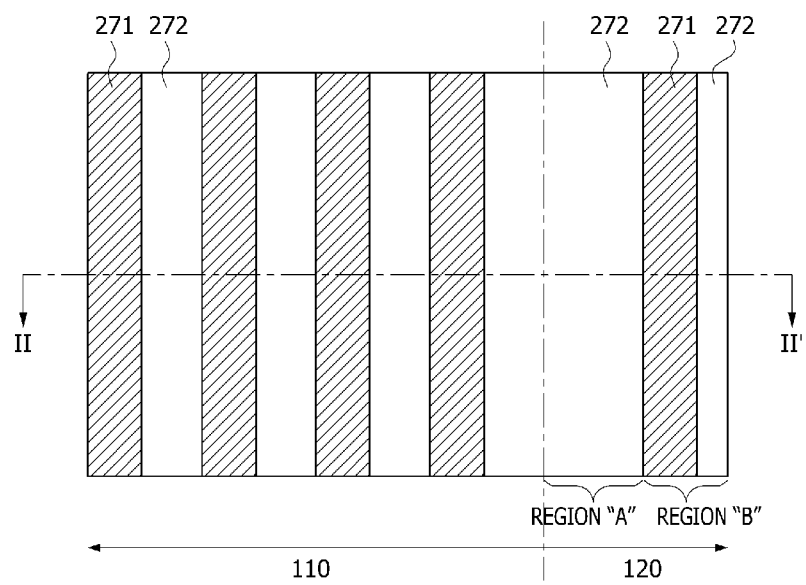
Figure 14:
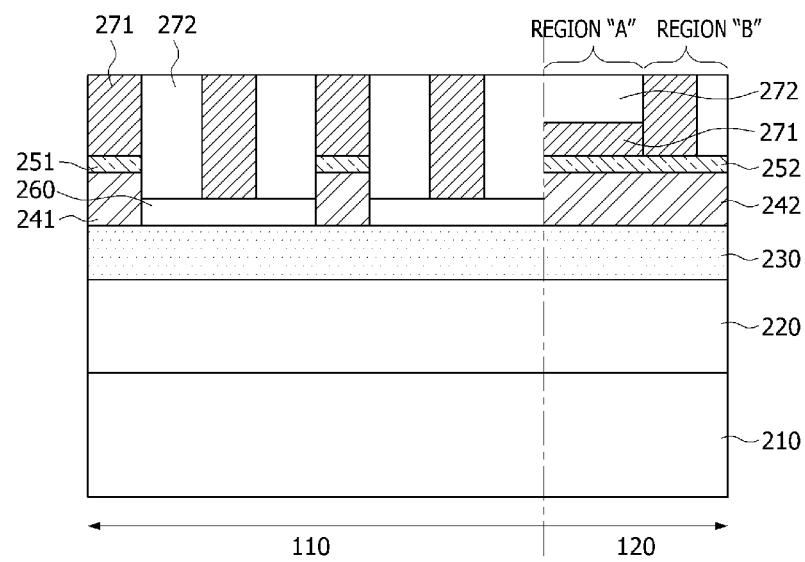

Referring to FIGS. 13 and 14, the BCP layer 300 may be annealed to be phase-separated into first polymer blocks 271 and second polymer blocks 272. For example, if the BCP layer 300 is formed of a PS-PMMA co-polymer material, the BCP layer 300 may be phase-separated into PS blocks (corresponding to the first polymer blocks 271) and PMMA blocks (corresponding to the second polymer blocks 272) by an annealing process. In the first region 110, the first polymer blocks 271 composed of the PS blocks may be disposed on the guide patterns 251 and vertically aligned with the guide patterns 251. If the guide patterns 251 are formed to have line shapes, the first polymer blocks 271 may also be formed to have line shapes, as illustrated in FIG. 13.

The first polymer blocks 271 and the second polymer blocks 272 may be alternately arrayed on each of the neutralization patterns 260. In such an embodiment, the second polymer blocks 272 may be formed on edges of the neutralization patterns 260 to contact the first polymer blocks 271 disposed on the guide patterns 251. As such, the first polymer blocks 271 and the second polymer blocks 272 having line shapes may be alternately arrayed on each of the neutralization patterns 260. A thickness of the first polymer blocks 271 on the neutralization patterns 260 may be substantially the same as a thickness of the second polymer blocks 272 on the neutralization patterns 260. In contrast, a thickness of the first polymer blocks 271 on the neutralization patterns 260 may be greater than a thickness of the first polymer blocks 271 on the guide patterns 251. This is due to a level difference between top surfaces of the neutralization patterns 260 and top surfaces of the guide patterns 251 when top surfaces of first polymer blocks 271 are level with top surfaces of second polymer blocks 272.

The first polymer blocks 271 and the second polymer blocks 272 may be alternately arrayed in a horizontal direction on a portion (of the guide pattern 252 in the second region 120 (region "B"), and may be vertically stacked on another portion of the guide pattern 252 in the second region 120 (region "A"), as illustrated in FIGS. 13 and 14. The various arrangements may occur when the guide pattern 252 is a single extends across an entire portion of the second region 120. Thus, the first polymer blocks 271 and the second polymer blocks 272 may be randomly arrayed in the second region 120.

Pattern images of the first polymer blocks 271 and the second polymer blocks 272 randomly arrayed in the second region 120 are not transferred into the underlying pattern formation layer 230 when the pattern formation layer 230 in the first region 110 is patterned in a subsequent process. In region "B", a thickness of the first polymer blocks 271 may be substantially the same as a thickness of the second polymer blocks 272. In addition, the thickness of the first and second polymer blocks 271 and 272 formed in region "B" may be substantially the same as a thickness of the first polymer blocks 271 formed on the guide patterns 251 in first region 110.

Figure 15:
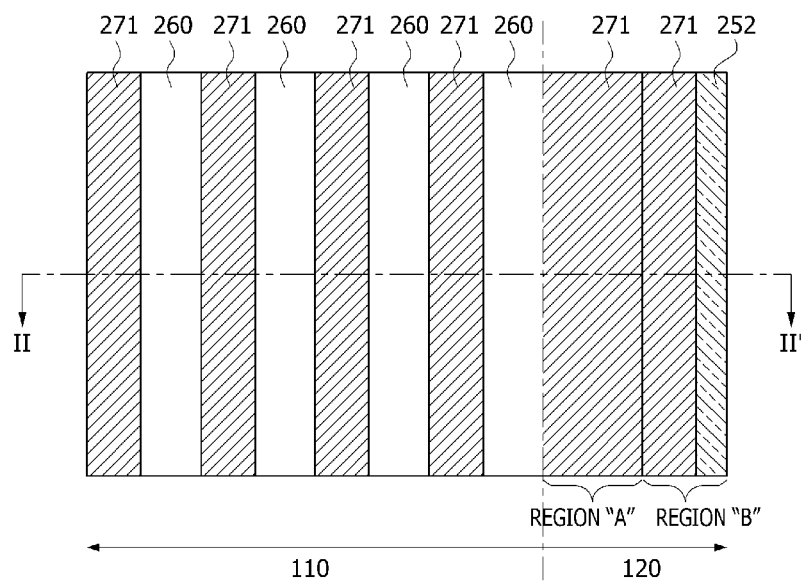
Figure 16:
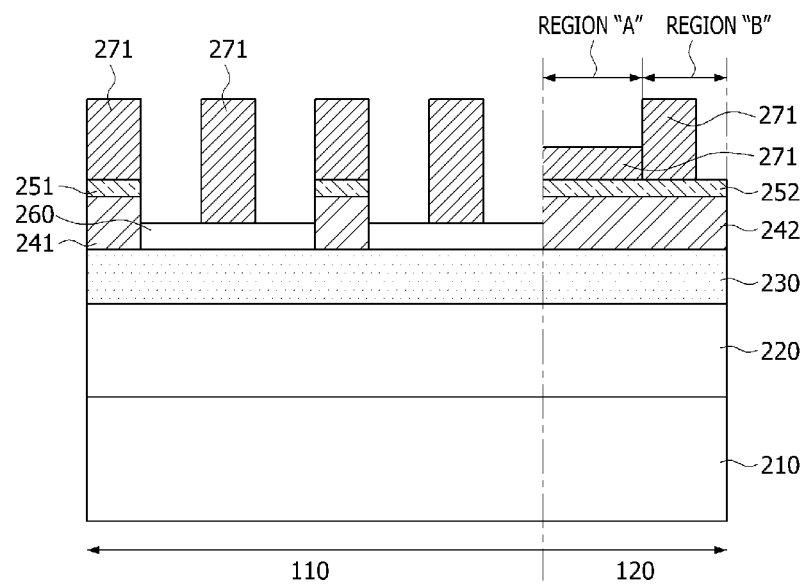

Referring to FIGS. 15 and 16, the second polymer blocks 272 may be selectively removed. The first polymer blocks 271 (e.g., PS blocks) may have a solubility which is different from a solubility of the second polymer blocks 272 (e.g., PMMA blocks). Thus, the second polymer blocks 272 may be selectively removed using a wet etch process that employs a specific solution, which is capable of selectively dissolving only the second polymer blocks 272, as an etchant. Selective removing the second polymer blocks 272 may expose portions of the neutralization patterns 260 in the first region 110.

While the second polymer blocks 272 are selectively removed, the second polymer block 272 stacked on the first polymer block 271 in region "A" may also be removed to expose the underlying first polymer block 271. In such an embodiment, the underlying first polymer block 271 may also be etched to reduce a thickness of the first polymer block 271. While the second polymer blocks 272 are selectively removed, the second polymer blocks 272 laterally arrayed in region "B" may also be removed to expose portions of the underlying guide pattern 252 in the second region 120. In such an embodiment, the underlying guide pattern 252 may also be etched to reduce a thickness of the guide pattern 252 when a thickness of the second polymer block 272 in region "B" is less than a thickness of the second polymer blocks 272 in the first region 110.

Figure 17:
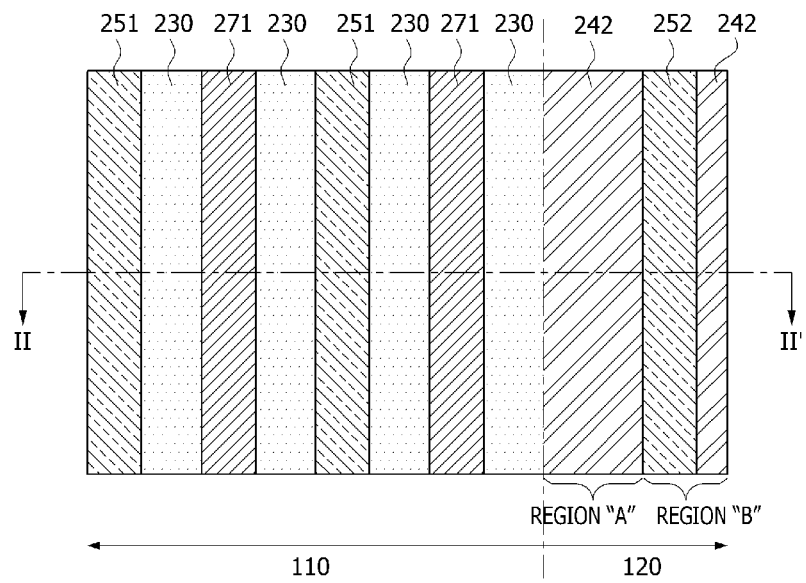
Figure 18:
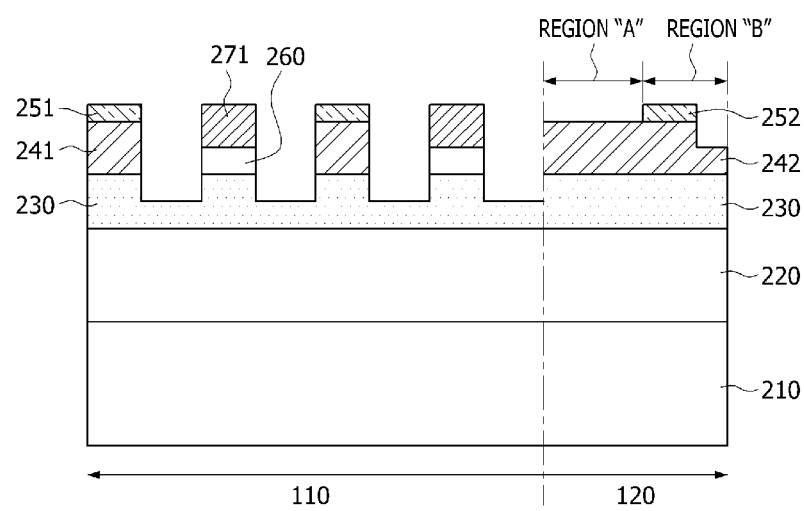

Referring to FIGS. 17 and 18, the exposed portions of the neutralization patterns 260 may be etched using the first polymer blocks 271 as etch masks to expose portions of the lower hard mask layer 230 in the first region 110. Subsequently, the exposed portions of the lower hard mask layer 230 in the first region 110 may be etched by a predetermined thickness. While the neutralization patterns 260 and the lower hard mask layer 230 in the first region 110 are etched using the first polymer blocks 271 as etch masks, portions of first polymer blocks 271 on the guide patterns 251 may be completely removed to expose the guide patterns 251 in the first region 110. In the meantime, while the neutralization patterns 260 and the lower hard mask layer 230 in the first region 110 are etched using the first polymer blocks 271 as etch masks, the first polymer blocks 271 on the neutralization patterns 260 may be partially etched. Thus, top surfaces of the first polymer blocks 271 remaining on the neutralization patterns 260 may be substantially coplanar with top surfaces of the guide patterns 251.

In an embodiment, the first polymer blocks 271 and the guide pattern 252 in region "A" of the second region 120 may be completely removed to expose a portion of the second upper hard mask pattern 242 and the exposed portion of the second upper hard mask pattern 242 may also be partially etched by a predetermined thickness. The first polymer blocks 271 in region "B" of the second region 120 may be completely removed to expose a top surface of the guide pattern 252.

The exposed guide pattern 252 in region "B" of the second region 120 may be removed to expose a portion of the second upper hard mask pattern 242, and the exposed portion of the second upper hard mask pattern 242 may also be etched by a predetermined thickness. Thus, a thickness of the etched portion of second upper hard mask pattern 242 remaining in the region "B" may be less than a thickness of the portion of second upper hard mask pattern 242 remaining in region "A".

Figure 19:
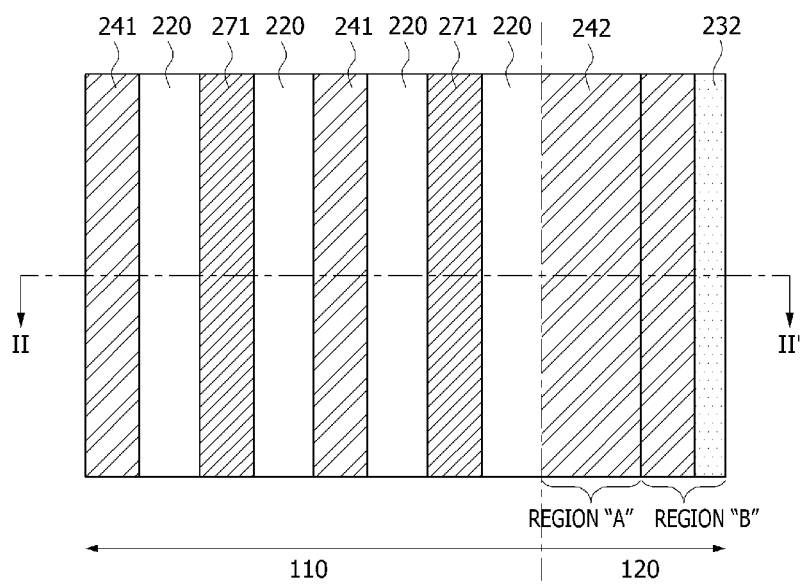
Figure 20:
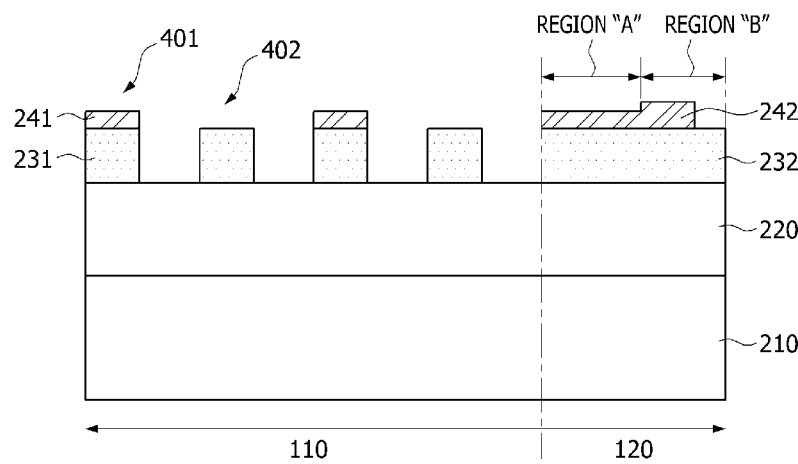

Referring to FIGS. 19 and 20, the exposed portions of the lower hard mask layer 230 in the first region 110 may be continuously etched until the pattern formation layer 220 is exposed. As a result, arrayed first lower hard mask patterns 231 may be formed in the first region 110, and a second lower hard mask pattern 232 may be formed over an entire surface the second region 120. When the first lower hard mask patterns 231 are formed, the guide patterns 251 and the first polymer blocks 271 remaining in the first region 110 may be completely removed and a predetermined thickness of the first upper hard mask patterns 241 may remain. Accordingly, line-shaped structures 401 and line-shaped structures 402 may be alternately arrayed on the pattern formation layer 220 in the first region 110. Each line-shaped structure 401 may include first lower hard mask pattern 231 and first upper hard mask pattern 241 which are sequentially stacked, and each of the line-shaped structures 402 may consist of the first lower hard mask pattern 231.

An etch rate of the second upper hard mask pattern 242 may be lower than an etch rate of the second lower hard mask pattern 232. Accordingly, the second upper hard mask pattern 242 may still remain in second region 120 even after the first lower hard mask patterns 231 are formed. A thickness of the second upper hard mask pattern 242 remaining in region "A" of the second region 120 may be substantially the same as a thickness of the first upper hard mask patterns 241 remaining in the first region 110.

In an embodiment, an etch rate of the second upper hard mask pattern 242 may be lower than an etch rate of the second lower hard mask pattern 232. Thus, a remaining portion of the second upper hard mask pattern 242 located under the guide pattern 252 (see FIG. 18) in region "B" may remain to have a thickness which is greater than a thickness of the second upper hard mask pattern 242 remaining in region "A".

A portion of the second upper hard mask pattern 242 that was previously located under the second polymer block 272 (see FIG. 14) in region "B" may be removed to expose the second lower hard mask pattern 232. In such an embodiment, patterns are not formed in the second lower hard mask pattern 232 in the second region 120 when the first lower hard mask patterns 231 are formed in the first region 110.

Figure 21:
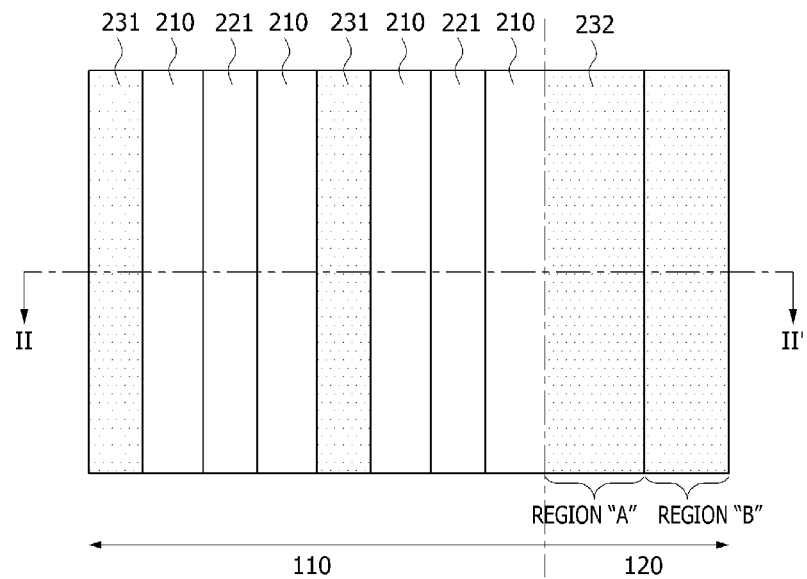
Figure 22:
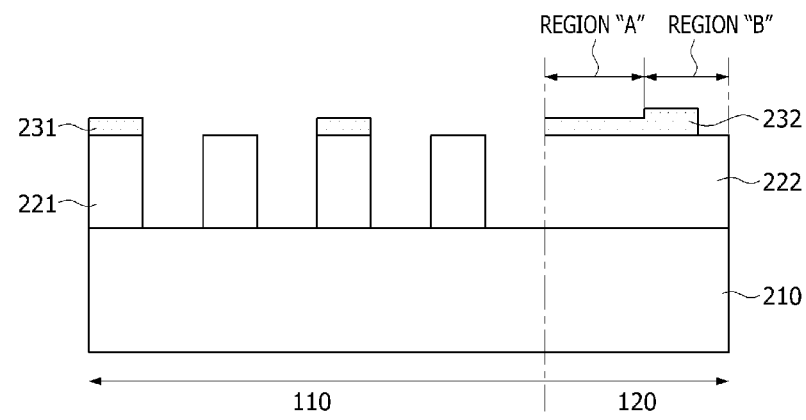

Referring to FIGS. 21 and 22, the pattern formation layer 220 may be etched in region "A" using line-shaped structures 401 and 402 of FIG. 20 and the second lower hard mask pattern 232 as etch masks until an underlying layer, for example, substrate 210 is exposed. As a result, final patterns 221 defining openings that expose portions of the substrate 210 may be formed in the first region 110, and a contiguous dummy layer 222 may be formed over an entire upper surface of the second region 120.

When an etch process is performed to form the final patterns 221 and the dummy layer 222, the first upper hard mask patterns 241 remaining in the first region 110 may be completely removed and the first lower hard mask patterns 231 may still remain. In an embodiment, the second upper hard mask pattern 242 may be completely removed and a predetermined thickness of the second lower hard mask pattern 232 may remain. A thickness of the second lower hard mask pattern 232 remaining in region "A" of the second region 120 may be substantially the same as a thickness of the first lower hard mask patterns 231 remaining in the first region 110.

Meanwhile, a portion of the second upper hard mask pattern 242 that was previously located under the guide pattern 252 (see FIG. 18) in region "B" may be completely removed and a predetermined thickness of a portion of the second lower hard mask pattern 232 in region "B" may remain. A portion of the second lower hard mask pattern 232 remaining in region "B" may be thicker than a portion of the second lower hard mask pattern 232 remaining in region "A".

In addition, a portion of the second lower hard mask pattern 232 that was previously located under the second polymer block 272 (see FIG. 14) in region "B" may be removed to expose the dummy layer 222. In an embodiment, the dummy layer 222 in the second region 120 is not patterned when the final patterns 221 are formed in the first region 110. With reference to FIGS. 13 and 14, patterns corresponding to the first and second polymer blocks 271 and 272 disposed in the second region 120 are not transferred into the pattern formation layer 220. After the final patterns 221 are formed in the first region 110, the first lower hard mask patterns 231 and 232 remaining in the first and second regions 110 and 120 may be removed.

In an embodiment, pattern images generated by two or more distinct polymer blocks randomly disposed in a second region are not transferred into an underlying pattern formation layer disposed in a non-pattern region while fine patterns are formed in a pattern region of the pattern formation layer using a BCP layer. Fine pattern structures and fabrication methods may be used in polarizing plates or in reflective lenses of reflective liquid crystal display (LCD) units. The fine pattern structures which may be nano structures may be used in polarizing plates as well as other polarizing parts including display panels. For example, nano structures according to embodiments of this disclosure may be used in fabrication array substrates including thin film transistors or in processes for directly forming the polarizing parts on color filter substrates. Further, embodiments of nano structures may be used in molding processes for fabricating nanowire transistors or memories, electronic components for patterning nano-scaled interconnections, catalysts of solar cells and fuel cells, etch masks, organic light emitting diodes (OLEDs), and gas sensors.

Methods according to the aforementioned embodiments and structures formed thereby may be used in fabrication of integrated circuit (IC) chips. The IC chips may be supplied to users in a raw wafer form, in a bare die form or in a package form. The IC chips may be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

While embodiments of the present disclosure have been particularly shown and described with reference to specific examples, it will be understood that various changes in form and details may be made therein without departing from the spirit and scope of the following claims.

What is claimed is:

1. A fine pattern structure comprising:
    a lower hard mask layer disposed on a pattern formation layer having a first region and a second region;
    a plurality of first upper hard mask patterns disposed on the lower hard mask layer in the first region to expose portions of the lower hard mask layer;
    a second upper hard mask pattern covering an entire surface of the lower hard mask layer in the second region;
    guide patterns on respective ones of the first and second upper hard mask patterns;
    a plurality of neutralization patterns on respective ones of the exposed portions of the lower hard mask layer in the first region;
    a first block co-polymer layer covering the guide patterns in the first region and the plurality of neutralization patterns; and
    a second block co-polymer layer covering the guide pattern in the second region.

2. The fine pattern structure of claim 1, wherein the first region is a pattern region in which patterns are formed and the second region is a non-pattern region in which no patterns are formed.

3. The fine pattern structure of claim 1,
    wherein the guide patterns in the first region are disposed to be aligned with respective ones of the first upper hard mask patterns; and
    wherein the guide pattern in the second region is disposed to be aligned with the second upper hard mask pattern.

4. The fine pattern structure of claim 1, wherein each of the guide patterns includes the same material as any one of a plurality of distinct polymer blocks constituting the first block co-polymer layer.

5. The fine pattern structure of claim 1, wherein each of the first and second block co-polymer layers includes first polymer blocks and second polymer blocks which are distinct from the first polymer blocks.

6. The fine pattern structure of claim 5, wherein the first polymer blocks and the second polymer blocks constituting the first block co-polymer layer are alternately arrayed in a horizontal direction.

7. The fine pattern structure of claim 5, wherein the first polymer blocks and the second polymer blocks constituting the second block co-polymer layer are randomly arrayed.

8. The fine pattern structure of claim 5, wherein the first polymer blocks and the second polymer blocks constituting the second block co-polymer layer are irregularly arrayed in a vertical direction and in a horizontal direction.

9. The fine pattern structure of claim 5, wherein the second upper hard mask pattern has a thickness which is capable of remaining in the second region while the second polymer blocks in the first region are removed to expose portions of the neutralization patterns and the exposed portions of the neutralization patterns are removed.

10. The fine pattern structure of claim 1, wherein the neutralization patterns have a thickness which is less than a thickness of the first upper hard mask patterns.

11. The fine pattern structure of claim 1, wherein a width of each of the neutralization patterns is three times or greater than three times a width of each of the first upper hard mask patterns.

12. The fine pattern structure of claim 1, wherein the lower hard mask layer includes a silicon oxynitride (SiON) layer and the upper hard mask patterns include an oxide layer.

* * * * *